United States Patent
Ghanta et al.

(10) Patent No.: US 7,630,852 B1
(45) Date of Patent: Dec. 8, 2009

(54) METHOD OF EVALUATING INTEGRATED CIRCUIT SYSTEM PERFORMANCE USING ORTHOGONAL POLYNOMIALS

(75) Inventors: Praveen Ghanta, Tempe, AZ (US); Sarma Vrudhula, Chandler, AZ (US); Sarvesh Bhardwaj, Tempe, AZ (US)

(73) Assignee: Arizona Board of Regents, Scottdale, AZ (US)

( * ) Notice: Subject to any disclaimer, the term of this patent is extended or adjusted under 35 U.S.C. 154(b) by 0 days.

(21) Appl. No.: 11/556,766

(22) Filed: Nov. 6, 2006

Related U.S. Application Data (60) Provisional application No. 60/733,981, filed on Nov. 4, 2005.

(51) Int. Cl.
*G01R 27/28* (2006.01)

(52) U.S. Cl. ...................................................... 702/117
(58) Field of Classification Search ................. 702/117, 702/118, 119
See application file for complete search history.

(56) References Cited

U.S. PATENT DOCUMENTS 6,621,860 B1 * 9/2003 Yamaguchi et al. ......... 375/226

OTHER PUBLICATIONS

Sarma Vrudhula, Janet Wang and Praveen Ghanta, (Oct. 2006) "Hermite Polynomial based Interconnect Analysis in the Presence of Process Variations", Proc. IEEE Trans. on Computer-Aided Design of Integrated Circuits 25(10): pp. 2001-2011.
Janet Wang, Praveen Ghanta and Sarma Vrudhula, "Stochastic Analysis of Interconnect Performance in the Presence of Process Variations", Proc. IEEE Int'l Conf. On Computer-Aided Design (ICCAD), San Jose, Nov. 2004, pp. 880-886.

* cited by examiner

*Primary Examiner*—Drew A Dunn
*Assistant Examiner*—Stephen J Cherry
(74) *Attorney, Agent, or Firm*—McDonnell Boehnen Hulbert & Berghoff LLP (57) ABSTRACT

A method for analyzing IC system performance. The method includes receiving system variables that correspond to an IC system; normalizing the system variables; using an infinite dimensional Hilbert space, modeling a system response as a series of series of orthogonal polynomials; and, solving for coefficients of the series of orthogonal polynomials. A system equation or a simulated response may be used to solve for the coefficients. If a simulated response is used, the coefficients may be solved by using the statistical expectance of the product of the simulated system response and the series of orthogonal polynomials. Alternatively, a simulated system response may be used to generate coefficients by performing a least mean square fit.

18 Claims, 6 Drawing Sheets

METHOD OF EVALUATING INTEGRATED CIRCUIT SYSTEM PERFORMANCE USING ORTHOGONAL POLYNOMIALS

CROSS-REFERENCE TO RELATED APPLICATIONS

The present patent application claims priority under 35 U.S.C. §119(e) to U.S. Provisional Patent Application Ser. No. 60/733,981, filed on Nov. 4, 2005, the entire contents of which are incorporated herein by reference as if fully set forth in this description.

GOVERNMENT FUNDING

The invention described herein was made with government support under the following grant number, CCR-0205227 and EEC-9523338 awarded by the National Science Foundation. The United States Government may have certain rights in the invention.

FIELD OF THE INVENTION

The present invention relates generally to the field of evaluation and simulation of integrated circuit (IC) system performance, and more particularly to a method of modeling an integrated circuit system using orthogonal polynomials that represent an IC system response.

BACKGROUND

Manufacturing process variations have emerged as the primary cause of performance degradation in today's integrated circuit systems (ICs). The variations cause a significant spread in the performance of the manufactured integrated circuits (ICs). This translates into a significant increase in uncertainty in the performance of manufactured integrated circuits. The variations in the integrated circuit components viz., the CMOS devices and metal interconnects are a manifestation of the inherent randomness associated with some of the semiconductor fabrication process steps. For example, the metal interconnect thickness is determined by the composition of the slurry used in the chemical mechanical polishing step of the fabrication process along with the quality of the pad used for polishing. The variations in the effective channel length of the CMOS devices are determined by the effectiveness of the critical dimension (CD) control ability of the fabrication process. The variations in various CMOS device parameters such as gate oxide thickness, dopant density and threshold voltages; and the variations in the metal interconnect width and thickness etc., result in variations in the circuit performance characteristics such as a CMOS gate delay time and voltage response, a CMOS gate active and leakage power consumption, a metal interconnect delay time and voltage response etc. Hence, efficient techniques are required for an accurate analysis of the integrated circuit performance in the presence of these variations. This integrated circuit performance analysis requires that delay time, power and voltage response models be developed for the CMOS gates, metal interconnects and other components of the integrated circuits.

SUMMARY

Therefore, a method for analyzing IC system performance is presented. The method may be incorporated into a software program, for example, and it may be used to generate a response of the IC system. The response, for example, may be a performance characteristic of the IC system that corresponds to a metal interconnect or a CMOS device. The equation may correspond to a delay time, a voltage response, or other performance aspect of one or more interconnects or CMOS devices within an IC system.

The example method includes receiving system variables that correspond to an IC system; normalizing the system variables; using an infinite dimensional Hilbert space, modeling a system response as a series of series of orthogonal polynomials; and, solving for coefficients of the series of orthogonal polynomials. In one example, a system equation may be used to solve for the coefficients. In another example, a simulated system response (i.e., derived from SPICE, Monte Carlo, or a perturbation simulations) may be used to solve for the coefficients.

The system variables may belong to one of the Gaussian, lognormal, gamma, beta, or uniform distributions. Alternatively, the variables may belong to an arbitrary probability distribution that is described by numerical data or statistical moments.

The system response is modeled as a series of orthogonal polynomials in an infinite dimensional Hilbert space. Preferably, if probability distribution is Gaussian, the polynomials are Hermite polynomials. However, other classes of orthogonal polynomials may be used, which include Laguerre, Jacobi, and Legendre polynomials. Furthermore, to use Hermite polynomials, the system variables of different probability distributions are transformed in to variables of a Gaussian probability distribution.

If a system equation is available, a norm between an error equation and a truncated form of the series of orthogonal polynomials may be used to create a deterministic equation. The error equation may be derived by substituting the series of orthogonal polynomials into the system equation. Next, the coefficients of the truncated series of orthogonal polynomials may then be solved using the deterministic equation.

However, if a system equation is not available, a simulated system response may be used to generate the coefficients. The coefficients may be solved by using the statistical expectance of the product of the simulated system response and the series of orthogonal polynomials. The statistical expectance is carried out by performing a multi-dimensional integration over the dimensionality space associated with the system variables. The multi-dimensional integration may be full quadrature or a sparse quadrature based and requires simulated system responses. The simulated system responses are obtained when the normalized system variables assume the values of zeroes of a set of orthogonal polynomials of order N+1. Next, the coefficients of the orthogonal polynomials of order N can be solved. In an alternative example, and if a system equation is not available, simulated system responses may be used to generate coefficients by performing a least mean square fit. The simulated system response values are obtained when the normalized system variables assume the zeroes of a set of orthogonal polynomials of order N+1.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF FIGURES

Certain example embodiments are described below in conjunction with the appended drawing figures, wherein like reference numerals refer to like elements in the various figures, and wherein.

DETAILED DESCRIPTION

A. Overview

Figure 1:
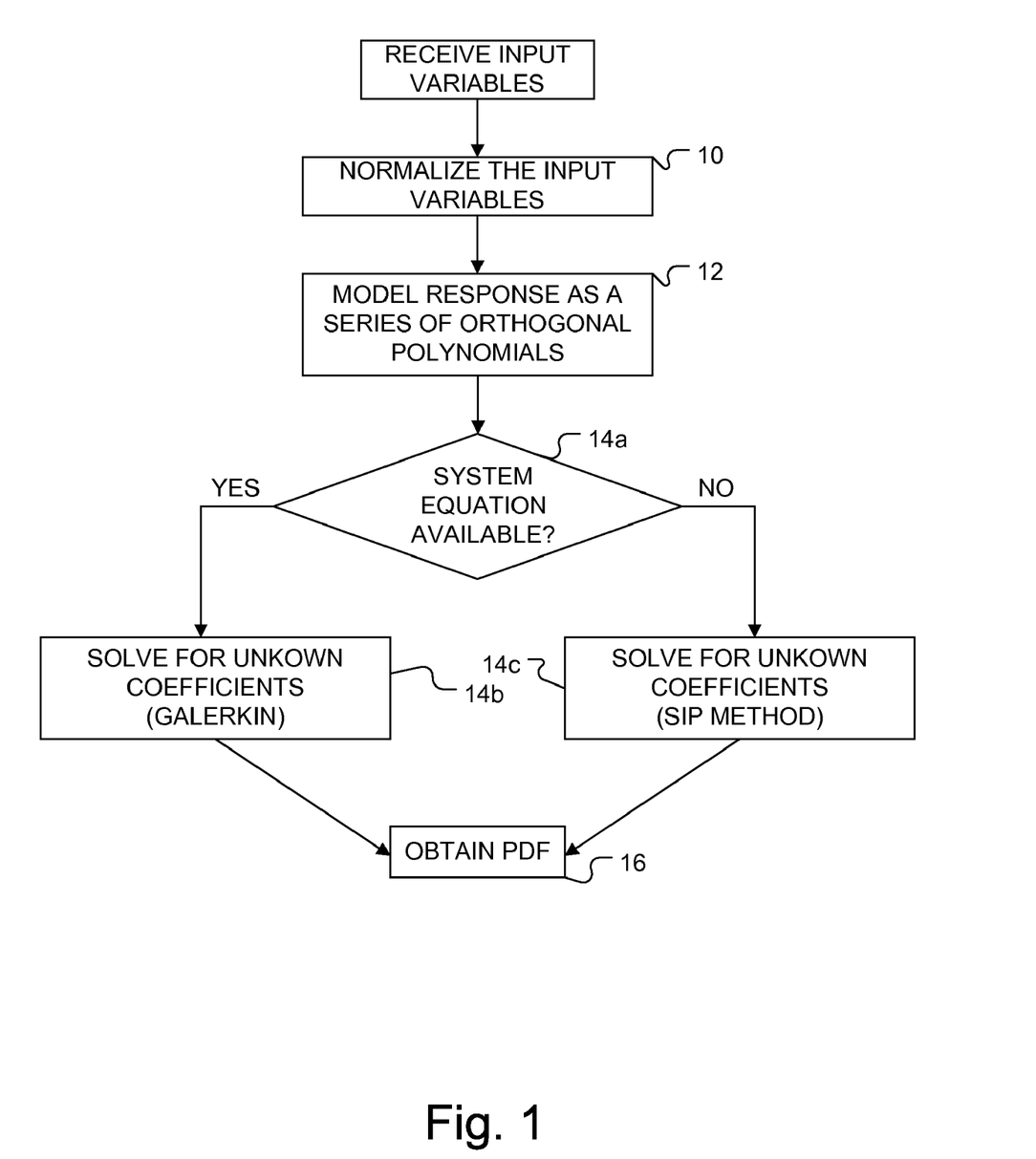
FIG. 1 is a flow diagram of a method for analyzing IC system performance, according to an example.

Described below are generalized and powerful techniques for the analysis of integrated circuit (IC) performance that are particularly suited to stochastic system parameters. These techniques are based on representation of a stochastic system response using an infinite series of orthogonal polynomials. FIG. 1 is a flow chart that shows a general overview. The statistical analysis includes normalizing input system variables, modeling the system response as a series of orthogonal polynomials in an infinite dimensional Hilbert space, solving for unknown coefficients of the orthogonal polynomials, and using the obtained coefficients to obtain a probability distribution function (PDF) of the system response, shown respectively at blocks 10, 12, 14a-c, and 16.

At block 12, the system response may, for example, be expressed as Hermite, Jacobi, Laguerre, or Legendre polynomials in an infinite dimensional Hilbert space. If the probability distribution of the random variables is Gaussian or lognormal, the system response is preferably expressed as Hermite polynomials. However, for beta, gamma, and uniform random variables, Jacobi, Laguerre, and Legendre polynomials may be preferable.

At blocks 14a-c, obtaining the unknown coefficients may be carried out in either one of two ways, which depends on whether there is a set of equations that describe a stochastic response. If these equations are available, the unknown coefficients may be obtained via a Galerkin method, shown in FIG. 2 at block 14b. However, if these equations are not available, the unknown coefficients may be obtained using the Stochastic Interpolation method (SIP), which is shown at block 14c. The Galerkin and SIP methods have a clear advantage over Monte Carlo and perturbation-based methods, each of which require a significantly large number of simulations. Moreover, these approaches provide an analytical representation of the system response and various statistics of the response that allow moments and probability distributions to be quickly computed. By way of example, this disclosure presents and compares the Galerkin and SIP methods by applying them to interconnect voltage and delay analysis, power grid analysis, and delay/power analysis of CMOS gates. Also disclosed are the trade-offs involved in obtaining robust representations of the system vs. the cost of computational complexity.

B. Normalization of Input Variables

Figure 2:
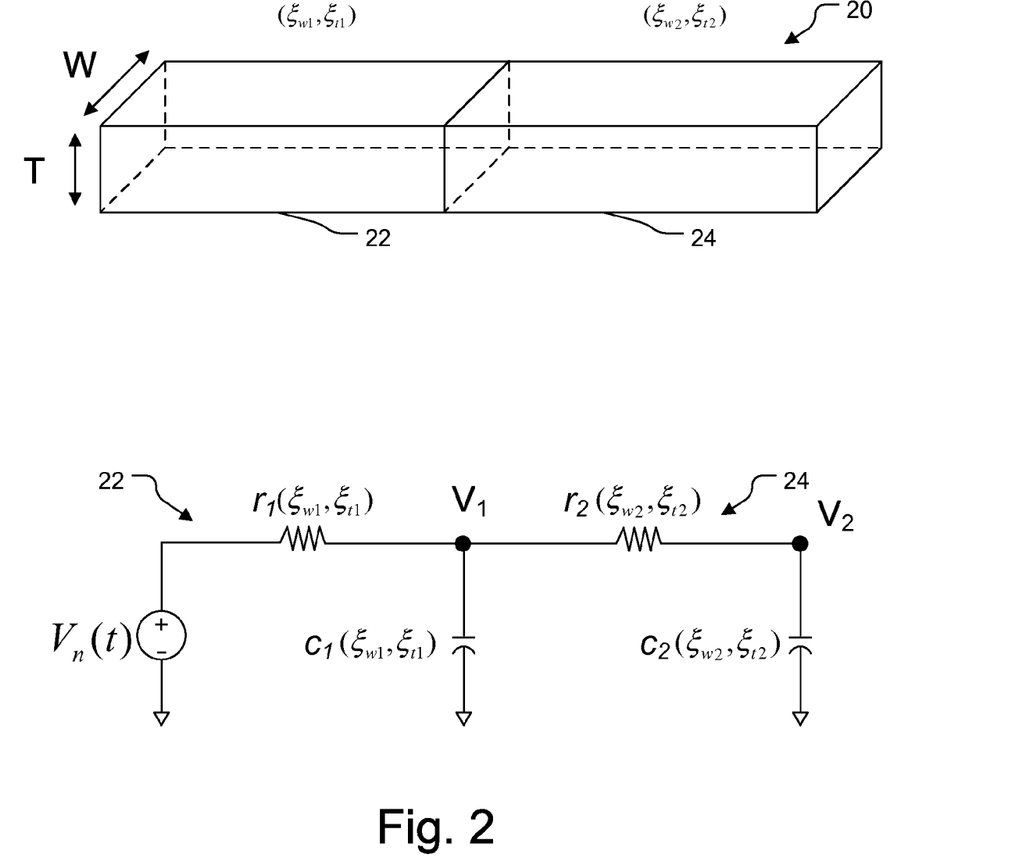
FIG. 2 is a schematic diagram of an interconnect that has a modeled response that includes a series of orthogonal polynomials that have coefficients derived from a Galerkin derivation, according to an example.

FIG. 2 shows a block diagram of a system with deterministic inputs and stochastic parameters, which are r in number. $\Omega$ denotes the sample space of the manufacturing outcomes, and for $\omega \in \Omega$, $\vec{\xi}(\omega) = \{\xi_1(\omega), \xi_2(\omega), \ldots, \xi_r(\omega)\}$ denotes a vector of r random variables representing the values of the r system parameters. Without loss of generality, it is assumed that the random variables in $\vec{\xi}(\omega)$ have zero mean and unit variance. Given a correlated set of random variables with arbitrary means and co-variances, an orthogonal transformation technique, such as principal component analysis, can always be used to obtain a set of zero mean, unit variance random variables. For example, if a random variable L has a mean $L_\mu$ and standard deviation $L_\sigma$, the random variable L can be expressed in a normalized form as $L = L_\mu + L_\sigma \xi_L$, where $\xi_L$ is a zero mean, unit variance random variable. Random variables may also be of a probability distribution that includes log-normal, Gamma, Beta, or Uniform distributions. In addition, random variables may also be of an arbitrary probability distribution that is described by numerical data or statistical moments. Furthermore, any of these random variables may be transformed into variables of a Gaussian probability distribution.

A system may receive a variety of inputs, which may include voltage, current, magnetic, or other types of signal waveforms. In FIG. 2, $\vec{X}(s) = \{X_1(s), X_2(s), \ldots, X_n(s)\}$ generally denotes such an input to a system in the frequency domain and $H(s, \vec{\xi}(\omega))$ represents the stochastic impulse response of a system. Thus, the stochastic response of the system to the input $\vec{X}(s)$ is denoted by $\vec{Y}(s, \vec{\xi}(\omega)) = \{Y_1(s, \vec{\xi}(\omega)), \ldots, Y_m(s, \vec{\xi}(\omega))\}$. For a fixed s, $Y_i(s, \vec{\xi}(\omega))$, $i = 1, \ldots, m$ is a random variable. The function space of all such random variables is denoted by $\Theta : \Omega \to R$. Characterization of the statistics of $\vec{Y}(s, \vec{\xi}(\omega))$ either needs an explicit representation of the $H(s, \vec{\xi}(\omega))$ of a system or some functional form relating the inputs to the outputs.

The following input equation describes an interconnect that may be located within an IC, for example. The interconnect is represented as an RC network using a modified nodal analysis (MNA) equation:

$$X(s) = (G(\vec{\xi}(\omega)) + sC(\vec{\xi}(\omega)))Y(s, \vec{\xi}(\omega)) \quad (1)$$

having a coefficient matrix: $M(s, \vec{\xi}(\omega)) = (G(\vec{\xi}(\omega)) + sC(\vec{\xi}(\omega)))$. The interconnect conductance $G(\vec{\xi}(\omega))$ and capacitance $C(\vec{\xi}(\omega))$ are functions of the random variables representing interconnect width ($\xi_1(\omega)$) and thickness ($\xi_2(\omega)$). For a fixed s, $M(s, \vec{\xi}(\omega))$ and $Y(s, \vec{\xi}(\omega))$ are random variables. For a particular manufacturing outcome $\omega$, $M(s, \vec{\xi}(\omega))$ and $Y(s, \vec{\xi}(\omega))$ are functions of s. When $M(s, \vec{\xi}(\omega))$ is explicitly specified, the Galerkin method may be used to obtain $Y(s, \vec{\xi}(\omega))$. However, if $M(s, \vec{\xi}(\omega))$ is not explicitly specified, SIP method may be used.

C. Expressing the System Response as an Infinite Series of Orthogonal Polynomials In real life systems, where the parameters are bounded, $Y(s, \vec{\xi}(\omega))$ can be assumed to be a second order process, i.e. all the random variables have a finite variance. Accordingly, Y(s, $\vec{\xi}(\omega)$) may be expressed as a series of orthogonal polynomials in an infinite dimensional Hilbert space of random variables. Two elements, x and y, of an inner product space are orthogonal if ⟨x,y⟩=0; furthermore, these elements are orthonormal if ||x||=||y||=1.

The theory of orthonormal expansions in a Hilbert space are well known and are particularly useful as the completeness of Hilbert space guarantees the convergence of all Cauchy sequences, without actually knowing the limits of the sequences. For example, let H be a vector space with an inner product ⟨·, ·⟩ defined. The norm in H is $||f||=\sqrt{\langle f,f \rangle}$, and the metric is d(f,g)=||f−g||. H is called a Hilbert space if H is complete as a metric space. Also, if $\{\Psi_k\}_{k=1}^{\infty}$ is an orthonormal set in H the following are equivalent: If ⟨x,$\Psi_k$⟩=0 for all k, then x=0 and the set $\{\Psi_k\}_{k=1}^{\infty}$ is called the orthonormal basis of H; and, for each $$x \in H, x = \sum_{k=1}^{\infty} \langle x, \Psi_k \rangle \Psi_k,$$

where the sum on the right converges in norm to x. Thus, the significance of an orthonormal basis arises from the fact that any element in the Hilbert space can be represented as an infinite series of the orthonormal basis.

As presented above, Θ is an infinite dimensional function space. In order to obtain an infinite series representation of any stochastic process Y (s, $\vec{\xi}(\omega)$)∈Θ, an inner product needs to be defined on Θ. Let P be the probability measure on Ω. If the inner product in Θ is defined as the expectation of the product of ϕ, Ψ∈Θ, then Θ is an infinite dimensional Hilbert space, $H_\Theta$:

$$\langle \phi, \Psi \rangle = E(\phi, \Psi) = \int_\Omega \phi \Psi dP \quad (2)$$

Hence, using the results outlined above any stochastic process Y (s, $\vec{\xi}(\omega)$) can be represented as:

$$Y(s, \vec{\xi}(\omega)) = \sum_{i=1}^{\infty} \alpha_i(s) \Psi_i(\vec{\xi}(\omega)) \quad (3)$$

where {$\alpha_i(s)$} are deterministic coefficient functions, $\vec{\xi}(\omega)$ are zero-mean unit variance (orthonormal) random variables and {$\Psi_i(\vec{\xi}(\omega))$} are a complete set of multi-dimensional orthogonal polynomials in the random variables $\vec{\xi}(\omega)$ (orthonormal basis). The equality in equation 3 represents convergence in the norm which is guaranteed by the completeness of $H_\Theta$. Since the inner product defined in equation 2 is dependent on the probability measure of Ω, different orthonormal bases are obtained for different probability measures.

In general, for any given probability distribution of the random variables $\vec{\xi}(\omega)$, every stochastic process Y (s, $\vec{\xi}(\omega)$)∈$H_\Theta$ can be represented as an infinite series of Hermite polynomials of a set of orthonormal random variables. This can be done because a set of random variables can always be transformed into a function of standard normal random variables by simple transformation. Alternatively, for distributions other than Gaussian, appropriate orthogonal polynomials from the Askey scheme can be used as a basis. For example, if the underlying random variables are Gaussian or lognormal, then the preferable choice (with respect to speed of convergence) would be the above described Hermite polynomials (further described below). However, for beta, gamma, and uniform random variable, the preferable choices would be Jacobi, Laguerre, and Legendre polynomials respectively.

Hermite polynomials form an orthonormal bases for $H_\Theta$ under the Gaussian probability measure. A Hermite polynomial of order p is defined as:

$$H_p(\{i_1, i_2, \ldots, i_p\}) = (-1)^p e^{\frac{1}{2}\vec{\xi}^t\vec{\xi}} \frac{\partial^p}{\partial i_1 \partial i_2 \ldots \partial i_p} e^{-\frac{1}{2}\vec{\xi}^t\vec{\xi}} \quad (4)$$

where $\vec{\xi} = \{\xi_1, \xi_2, \ldots \infty\}$ is a collection of variables and where $\{i_1, i_2, \ldots i_p\}$ are any variables from the set $\vec{\xi}$ allowing repetitions. It should be noted that if there are r variables then there will be (p+r−1)!/p!(r−1)! Hermite polynomials of order p. As an example, consider two variables $\vec{\xi} = \{\xi_1, \xi_2\}$. The Hermite polynomials shown in Table 1 are of order 0, 1, 2, and 3, and are derived using equation 4.

Although the number of random variables is finite, the order p and hence the number of terms in the expansion are infinite. For computational purposes, the infinite expansion needs to be truncated by projecting the expansion on to a finite dimensional space. If there are system equations representing the stochastic response processes, the infinite expansion can be projected to a finite dimensional space by minimizing the norm of the error between the actual response and the approximated response. This approach is known as Galerkin. However, if the system equations that describe the stochastic response are not available, SIP may be applied using a limited number of points to obtain the coefficients. Both methods are described below.

TABLE 1

| Order | Polynomial | Order | Polynomial |
|---|---|---|---|
| 0 | $H_0(\{\}) = 1$ | 1 | $H_1(\xi_1) = \xi_1$ |
|  |  |  | $H_1(\xi_2) = \xi_2$ |
| 2 | $H_2(\xi_1, \xi_1) = \xi_1^2 - 1$ | 3 | $H_3(\xi_1, \xi_1, \xi_1) = \xi_1^3 - 3\xi_1$ |
|  | $H_2(\xi_1, \xi_2) = \xi_1 \xi_2$ |  | $H_3(\xi_1, \xi_1, \xi_1) = \xi_1^2 \xi_2 - \xi_2$ |
|  | $H_2(\xi_2, \xi_2) = \xi_2^2 - 1$ |  | $H_3(\xi_2, \xi_2, \xi_1) = \xi_1 \xi_2^2 - \xi_1$ |
|  |  |  | $H_3(\xi_2, \xi_2, \xi_2) = \xi_2^3 - 3\xi_2$ |

D. Obtaining Unknown Coefficients of the Random Variables

1. Galerkin Method

The MNA equation of an interconnect was given above as $X(s) = (G(\vec{\xi}) + sC(\vec{\xi}(\omega)))$. The response, Y (s,$\vec{\xi}$), can be approximated by truncating the response as:

$$\hat{Y}_P(s, \vec{\xi}) = \sum_{i=1}^{N} \alpha_i(s) \psi_i(\vec{\xi}) \quad (5)$$

where N is related to p by $$N = \sum_{j=0}^{p} \binom{p-1+j}{j} \qquad (6)$$

The error between the actual response and the approximated response is $$\Delta_p(s, \vec{\xi}) = X(s) - (G(\vec{\xi}) + s\, C(\vec{\xi}(\omega)))\hat{Y}_p(s, \vec{\xi}) \qquad (7)$$

The principle of orthogonality states that the best approximation to the response $Y(s, \vec{\xi})$ is the one that is orthogonal to the error term $\Delta_p(s, \vec{\xi})$. The orthogonality is with respect to the underlying norm of the Hilbert space $H_\Theta$. This application of the principle of orthogonality to minimize the error is called the Galerkin method. Thus, the deterministic coefficients can be obtained by solving the following system of equations.

$$\langle \Delta_p(s,\vec{\xi})\Psi_i(s,\vec{\xi})\rangle = E(\Delta_p(s,\vec{\xi})\Psi_i(s,\vec{\xi})) = 0, \text{ for } i=1,\ldots,N \qquad (8)$$

For example, if $\vec{\xi} = \{\xi_1, \ldots, \xi_r\}$, are random variables with a probability density function $W(\vec{\xi})$, then the inner product $\langle \Delta_p(s,\vec{\xi})\Psi_i(s,\vec{\xi})\rangle$ is given by $$\int_{-\infty}^{\infty}\int_{-\infty}^{\infty} \Delta_p(s,\vec{\xi})\Psi_i(\vec{\xi})W(\vec{\xi})d\vec{\xi}_1 d\vec{\xi}_2 = 0 \qquad (9)$$

Note that the integration in equation 9 is over the basis of the random variables $\vec{\xi}$. Hence, the resulting system of equations from equation 8 is a deterministic system in the unknown coefficients $\{\alpha_i\}$ and is completely independent of the random variables $\vec{\xi}$. Thus, the statistical analysis has been simplified from solving a stochastic system to that of solving a deterministic system. An example application of the Galerkin method is further described below with reference to FIG. 3.

2. Stochastic Interpolation Method (SIP)

In the SIP method, model coefficients are derived using multivariate interpolation. Primarily, there are two methods that may be employed in SIP a sparse grid method and a stochastic heuristic method. Both these methods are extensions of the traditional full quadrature grid based interpolation, which becomes very expensive in terms of simulation time as the number of process variables increases (>5). For example, if n indicates the number of variables and p the order of the delay polynomial expansion, then the full quadrature-grid based interpolation requires $(p+1)^n$ interpolation runs (e.g., via SPICE software runs). The number of interpolation runs required by sparse grid method is proportional to $n^{(p+1)}/(p+1)!$. The number of interpolation runs required by a stochastic heuristic method is proportional to $(p+1)^n/(n!(p+1)!)$. Both of these methods may be used to develop gate delay and leakage power models in terms of both the process and environmental variables together. With out this, a separate statistical delay and leakage model needs to be obtained and maintained for different combinations of the environmental (deterministic) variables. These methods are also general enough to handle correlated process variables of any given distribution, (e.g.,) Gaussian, gamma, beta, lognormal etc. This is facilitated through a transformation of given set of correlated Gaussian and non-Gaussian variables in to a set of independent Gaussian random variables. This transformation serves as an alternative to Independent Component Analysis, which cannot handle the case of a mixed-set of correlated Gaussian and non-Gaussian variables. Both the sparse grid and heuristic methods deliver faster convergence and significant speed-ups (of the order of 100x-1000x) over Monte Carlo and Latin Hyper Cube sampling schemes with respect to the number of interpolation runs required for comparable accuracy.

In the Gaussian (Full) and sparse quadrature as well as the Heuristic solutions the delay may be expressed as a series in the orthonormal basis $\Psi_k(\vec{\xi})$ as, $$d = \sum_{k=1}^{NT(N_{VAR},p)} \alpha_k \Psi_k(\vec{\xi}) \qquad (10)$$

Where $\alpha_k$ can be obtained accurately be taking the inner produce of this equation with $\Psi_k(\vec{\xi})$ on both sides, which yields the following.

$$\alpha_k = \langle d(\vec{\xi}), \Psi_k(\vec{\xi})\rangle \qquad (11)$$

And, in all of three of these methods, using the principles of orthogonality, $\alpha_k$ can be evaluated.

2.1 Full and Sparse Quadrature Based Solution 2.11 Univariate Gaussian Quadrature Consider a univariate integral where the integrand is a polynomial of order r (in $\xi$) weighted by a function $W(\xi)$. If $P(\xi)$ is a polynomial of order r in the variable $\xi$, then $$Q^{p+1} = \int_a^b P_r(\xi)W(\xi)d\xi = \sum_{i=1}^{p+1} w_i P_r(\xi_i) \qquad (12)$$

is exact if the points $\xi_i$, i=1, ..., (p+1) are the series of orthogonal polynomials $\Psi_{p+1}(\xi)$ with respect to the weight function $W(\xi)$, and if $r \leq (2p+1)$, and if $w_i$ are defined by, $$w_i = \int_a^b l_i(\xi)W(\xi)d\xi \qquad (13)$$

Where $l_i(\xi)$ are Lagrangian interpolating polynomials of order i and [a,b] is the range of $\xi$. The above equations show that the zeroes of orthogonal polynomials with respect to $W(\xi)$ serve as an optimal set of points the integrand $P_r(\xi)$ needs to be sampled at in evaluating the integral denoted by $Q^{p+1}$. For a vast majority of weight functions, the zeros of corresponding orthogonal polynomials and the Gaussian quadrature weights can be readily obtained from the recursive relations that exist for the orthogonal polynomials.

2.12 Multivariate Gaussian Quadrature

Consider a vector of n independent process variables $\vec{\xi}=(\xi_1, \ldots, \xi_n)$, and where the joint probability density function of $\vec{\xi}$ is simply the produce of probability density functions in each variable $\xi_i$, $i=1, \ldots, n$, i.e., $$W(\xi_1, \xi_2, \ldots, \xi_n) = W_1(\xi_1) W_2(\xi_2) \ldots W_n(\xi_n) \quad (14)$$

Let the range of each variable $\xi_i$ be given by $[a_i, b_i]$. If k less than or equal to $(2p+1)$, then $\alpha_k$ can be exactly evaluated as follows using $(p+1)^{th}$ order quadrature in each of the n variable dimensions $$\alpha_k = \langle d(\vec{\xi}), \Psi_k(\vec{\xi}) \rangle \quad (15)$$

$$= \int_{a_1}^{b_1} \int_{a_2}^{b_2} \ldots \int_{a_n}^{b_n} d(\xi_1, \xi_2, \ldots \xi_n) \quad (16)$$
$$\Psi_k(\xi_1, \xi_2, \ldots \xi_n) W(\xi_1, \xi_2, \ldots \xi_n) d\xi_1 d\xi_2 \ldots d\xi_n$$

$$= \int_{a_1}^{b_1} \int_{a_2}^{b_2} \ldots \int_{a_n}^{b_n} d(\xi_1, \xi_2, \ldots \xi_n) \Psi_k(\xi_1, \xi_2, \ldots \xi_n) \quad (17)$$
$$W_1(\xi_1) W_2(\xi_2) \ldots W_n(\xi_n) d\xi_1 d\xi_2 \ldots d\xi_n$$

$$= \quad (18)$$
$$\int_{a_n}^{b_n} \left( \ldots \left( \int_{a_2}^{b_2} \left( \int_{a_1}^{b_1} d(\xi_1, \xi_2, \ldots \xi_n) \Psi_k(\xi_1, \xi_2, \ldots \xi_n) W_1(\xi_1) \right. \right. \right.$$
$$\left. \left. \left. d\xi_1 \right) W_2(\xi_2) d\xi_2 \right) \ldots \right) W_n(\xi_n) d\xi_n$$

$$= \sum_{i=1}^{(p+1)^n} w_{1i} w_{2i} \ldots w_{ni} d(\xi_{1i}, \xi_{2i}, \ldots \xi_{ni}) \Psi_k(\xi_{1i}, \xi_{2i}, \ldots \xi_{ni}) \quad (19)$$

$$Q_{\xi_1}^{p+1} \otimes Q_{\xi_2}^{p+1} \otimes \ldots Q_{\xi_n}^{p+1}, \quad (20)$$

where $Q_{\xi_i}^{p+1}$ indicates a univariate quadrature of order $(p+1)$ in the dimension of the variable $\xi_i$ and $\otimes$ indicates the tensor product.

It can be seen that the multivariate integral above can be evaluate recursively in one dimension at a given time. Thus, in the multivariate case with n variables there are a total of $(p+1)^n$ points that '$d(\vec{\xi}) \Psi_k(\vec{\xi})$' needs to be sampled at for evaluating the integral. Considering even 7 variables and an order 3 quadrature, there are a total of $3^8 = 2187$ points, which is quite expensive. Thus, while Gaussian quadrature offers significant advantage over Monte Carlo sampling if the variables are few (typically <5), the advantage is lost as the number of variables increases beyond a few variables.

2.13 Sparse Quadrature

Rather than taking quadratures of order $(p+1)$ in all the variable dimensions simultaneously, sparse quadrature takes an order in each individual dimension, such that the sum of all the individual orders is $(p+1)$. Thus, using sparse quadrature, consider:

$$\alpha_k = \langle d(\vec{\xi}), \Psi_k(\vec{\xi}) \rangle \quad (21)$$

$$= \int_{a_1}^{b_1} \int_{a_2}^{b_2} \ldots \int_{a_n}^{b_n} d(\xi_1, \xi_2, \ldots \xi_n) \quad (22)$$
$$\Psi_k(\xi_1, \xi_2, \ldots \xi_n) W(\xi_1, \xi_2, \ldots \xi_n) d\xi_1 d\xi_2 \ldots d\xi_n$$

$$= \sum_{p+1 \leq |i| \leq p+n}^{(p+1)^n} (-1)^{p-|i|} \binom{n-1}{p-|i|} Q_{\xi_1}^{i_1} \otimes Q_{\xi_2}^{i_2} \otimes \ldots Q_{\xi_n}^{i_n} \quad (23)$$

where $|i| = (i_1 + \ldots + i_r)$ is the order of sparse interpolation and $Q_{\xi_i}^{i_1}$ indicates univariate quadrature in the dimension of the variable $\xi_i$ and $\otimes$ indicates the tensor product.

As can be observed, for a fixed $(p+1)$, the number of point that the polynomial '$d(\vec{\xi}) \Psi_k(\vec{\xi})$' needs to be sampled at increases significantly slower than the multivariate Gaussian quadrature. The difference is that the Gaussian quadrature exactly integrates the polynomial '$d(\vec{\xi}) \Psi_k(\vec{\xi})$' if the polynomial's partial order in each of the variables $(\xi_1, \ldots, \xi_n)$ does not exceed $(2p+1)$. Sparse quadrature integrates the polynomial exactly if the total order across all the variables is at most $(2p+1)$.

The integration on the grid has an error bound of the following form.

$$\epsilon \leq c_{n,q} M^{-q} (\log M)^{(q+1)(n-1)} \quad (24)$$

The error $\epsilon$ is defined with respect to the following norm $$\|d(\vec{\xi})\| = \max\{\|D^\alpha d(\vec{\xi})\|_\infty | \alpha \in N_0^n, \alpha \leq q\} \quad (25)$$

where $c_{n,q}$ is a constant and q is the order of the maximum derivative that exists for the system response of interest '$d(\vec{\xi})$' (Which is readily obtained by the simulation). M is the number of interpolation points (which are a subset of the zeros of orthogonal polynomials). If '$d(\vec{\xi})$' is sufficiently smooth (q>1), the rate of convergence is faster with increase in the order of $|i|$ interpolation.

The number of sparse grid interpolation points increases as $$\propto \frac{n^{p+1}}{p+1!}.$$

Therefore, the cost increases much slowly with the number of variables n as compared to the full grid based interpolation, which increases as $(p+1)^n$.

2.2 Heuristic Based Solution

In the stochastic heuristic based method, the coefficients $\alpha_i$ are obtained by forcing the delay equations (see equation 10), to equal the delay response obtained by simulating the system, at the zeros of the orthogonal polynomials of order $(p+1)$. The minimum number of zeros at which the system response is required is equal to the number of unknown coefficients in the delay expansion ($NT(N_{VAR}, p)$ in equation 10). However, the number of zeros of the orthogonal polynomials for the case of n variables is $(p+1)^n$ while the number of unknown coefficients is only $NT(N_{VAR}, p)$, which is much less than $(p+1)^n$. So, a subset of these $(p+1)^n$ zeros are chosen, and a least mean square fit is obtained for $\alpha_i$ using the simulated system responses at zeros from this subset.

Typically in analyses involving least mean square fits, robust estimates are obtained if the number of simulation responses chosen is at least twice the number of unknown coefficients ($NT(N_{VAR}, p)$). Hence, in an analysis, the number of zeros can be chosen to be twice the number of unknown coefficients. Once the number of zeros to be used is fixed, the next step is to determine a characteristic based on which these zeros should be chosen from the available set of $(p+1)^n$ points. The characteristic used in the Heuristic based method is the proximity of the zeros to the origin. This characteristic is based on the fact that the zeros closer to origin fall in the regions of higher probability. Thus, the zeros are ordered in the ascending order based on their proximity to the origin and the first $2NT(N_{VAR}, p)$ zeros in the ordered list are chosen. Then obtain the required number of zeros, in this example say $\{\vec{\xi}_1, \vec{\xi}_2, \ldots, \vec{\xi}_M\}$, where $M \approx 2NT(N_{VAR},p)$. Then the system response $d_i$ is attained at each of these M zeroes from simulations. Also, from equation 10 for each of these zeroes, a function representation of the system response in the unknown coefficients at each of these M zeros from simulation. Also, from equation 10 for each of these zeros, obtain are a functional representation of the system response in the unknown coefficients $\alpha_i$. Thus, the system of equations $(M > NT(N_{VAR}, p))$ has been over determined.

$$d(\vec{\xi}_i) = \sum_{k=1}^{NT(N_{VAR},p)} \alpha_k \Psi_k(\vec{\xi}_i), \text{ where } i = \{1, \ldots, M\} \quad (26)$$

$$\text{Let } \vec{d} = (d(\vec{\xi}_i), \ldots, d(\vec{\xi}_M))^T \text{ and } \vec{\alpha} = (\alpha_1, \ldots, \alpha_{NT})^T \quad (27)$$

Using a least mean square fit of the system, $\vec{\alpha}$ can be determined as follows $$\vec{\alpha} = (X^T X)^{-1} \vec{d}, \text{ where the matrix } X = (X_{i,j})_{M \times NT(N_{VAR},p)}, \quad (28)$$

$$X_{i,j} = \Psi_j(\vec{\xi}_i), \text{ and } i = \{1, \ldots, M\}, j = \{1, \ldots, NT(N_{VAR}, p)\} \quad (29)$$

3. Application of the Galerkin and SIP Methods 3.1 Interconnect Analysis Using the Galerkin Method A Galerkin method is used to evaluate a metal interconnect 20, which is shown in FIG. 2. The metal interconnect 20 can be modeled as a second order RC circuit consisting of two RC sections 22, 24. The input excitation is a constant voltage source $V_n$. The metal interconnect 20 is subject to geometric process variations. Without loss of generality, assume that the only variations of significance are in the width W and in thickness T of each section and that they have a Gaussian distribution. These are modeled as zero-mean normalized Gaussian random variable $\xi_{w1}, \xi_{t1}$, for RC section 22 and $\xi_{w2}, \xi_{t2}$, for RC section 24. FIG. 2 shows these random variables and their capacitive and resistive contributions to a given interconnect in a schematic representation of the interconnect 20. Consider also that:

$$W_1(\xi) = \overline{W} + \sigma_{w1} \xi_{w1} \quad (30)$$

$$T_1(\xi) = \overline{T} + \sigma_{t1} \xi_{t1} \quad (31)$$

$$W_2(\xi) = \overline{W} + \sigma_{w2} \xi_{w2} \quad (32)$$

$$T_2(\xi) = \overline{T} + \sigma_{t2} \xi_{t2} \quad (33)$$

In general, the random variables $\xi_{w1}, \xi_{t1}, \xi_{w2}$, and $\xi_{t2}$ may be correlated. This implies that the resistance-conductance pairs of the RC sections 22,24 are (implicit) functions of all the random variables. Thus, $\xi = (\xi_{w1}, \xi_{t1}, \xi_{w2}, \text{ and } \xi_{t2})$.

In this example, the effects of the process variations are capture on $r_1$ (or $g_1$), $c_1$ and $r_2$ (or $g_2$), $c_2$ by expressing them as a linear function of the geometric random variables. This is consistent with the models developed in much of the contemporary literature. However, there are no limitations in choosing any particular form of the expansion for $g_1$, $g_2$, $c_1$, $c_2$ in terms of $\xi$. Thus:

$$g_1(\xi) = \overline{g}_1 + g_{w1} \xi_{w1} + g_{t1} \xi_{t1} \quad (34)$$

$$g_2(\xi) = \overline{g}_2 + g_{w2} \xi_{w2} + g_{t2} \xi_{t2} \quad (35)$$

$$c_1(\xi) = \overline{c}_1 + c_{w1} \xi_{w1} + c_{t1} \xi_{t1} \quad (36)$$

$$c_2(\xi) = \overline{c}_2 + c_{w2} \xi_{w2} + c_{t2} \xi_{t2} \quad (37)$$

where $\overline{g}_1$ and $\overline{g}_2$ are the mean values of the conductances, and $g_{w1}, g_{w2}, g_{t1}$, and $g_{t2}$ are the perturbations in $g_1$ and $g_2$ due to the variations in $\xi_{w1}, \xi_{w2}$ and $\xi_{t1}, \xi_{t2}, c_1$, and $c_2$ are represented in the same way.

To simplify the illustration assume that the variables $\xi_{w1}$ and $\xi_{w2}$ are the same, as are $\xi_{t1}$ and $\xi_{t2}$. Thus, $\xi_{w1} = \xi_{w2} = \xi_w$ and $\xi_{t1} = \xi_{t2} = \xi_t$. Also assume that $\xi_w$ and $\xi_t$ are orthonormal. Thus $\xi = (\xi_w, \xi_t)$. Since there are two nodes in this example, the response $Y(s, \xi)$ is a 2×1 vector. The terms in the MNA equation have the form:

$$X(s, \xi) = (U_n(s), 0)^T g_1(\xi) \quad (38)$$

$$= (U_n(s)\overline{g_1}, 0)^T + (U_n(s)g_{w1}, 0)^T \xi_w + (U_n(s)g_{t1}, 0)^T \xi_t \quad (39)$$

$$= X_1(s) + X_2(s)\xi_w + X_3(s)\xi_t \quad (40)$$

$$M(s, \xi) = G(\xi) + sC(\xi) \quad (41)$$

$$= \begin{pmatrix} g_1(\xi) + g_2(\xi) + s(c_1(\xi) + c_2(\xi)) & -(g_2(\xi) + sc_2(\xi)) \\ -(g_2(\xi) + sc_2(\xi)) & g_2(\xi) + sc_2(\xi) \end{pmatrix} \quad (42)$$

$$= M_a(s) + M_b(s)\xi_w + M_c(s)\xi_t \quad (43)$$

$$M_a(s) = \begin{pmatrix} \overline{g_1} + \overline{g_2} + s(\overline{c_1} + \overline{c_2}) & -(\overline{g_2} + s\overline{c_2}) \\ -(\overline{g_2} + s\overline{c_2}) & \overline{g_2} + s\overline{c_2} \end{pmatrix} \quad (44)$$

$$M_b(s) = \begin{pmatrix} g_{w1} + g_{w2} + s(c_{w1} + c_{w2}) & -(g_{w2} + sc_{w2}) \\ -(g_{w2} + sc_{w2}) & g_{w2} + sc_{w2} \end{pmatrix} \quad (45)$$

$$M_c(s) = \begin{pmatrix} g_{t1} + g_{t2} + s(c_{t1} + c_{t2}) & -(g_{t2} + sc_{t2}) \\ -(g_{t2} + sc_{t2}) & g_{t2} + sc_{t2} \end{pmatrix} \quad (46)$$

Matrices $M_a$, $M_b$, $M_c$, are 2×2 symbolic matrices (they become numerical matrices for a specific set or real values of $g_1, g_2, c_1, c_2$). Now expand the response $Y(s, \xi)$ using second order (p=2) Hermite polynomials, $$\Psi(\xi) = (\Psi_1(\xi), \Psi_2(\xi), \ldots, \Psi_6(\xi))^T \quad (47)$$

$$= (1, \xi_w, \xi_t, (\xi_w^2 - 1), \xi_w \xi_t, (\xi_t^2 - 1))^T \quad (48)$$

$$Y(s, \xi) = (V_1(s, \xi), V_2(s, \xi))^T \quad (49)$$

$$= \left( \sum_{j=1}^{6} \alpha_{1,j}(s) \Psi_j(\xi), \sum_{j=1}^{6} \alpha_{2,j}(s) \Psi_j(\xi) \right)^T \quad (50)$$

$$= \sum_{j=1}^{6} \alpha_j(s) \Psi_j(\xi) \quad (51)$$

The components of equation 65 are obtained by performing the integrations shown in equation 63 (see below). The matrix $\tilde{M}(s)$ is a matrix of matrices. Its dimensions are 12×12 and its components are computed as follows $$\tilde{M}_{i,j} = \frac{1}{2\pi} \int_{-\infty}^{\infty}\int_{-\infty}^{\infty} M(s,\xi)\Psi_i(\xi)\Psi_j(\xi) e^{-\frac{\xi_w^2+\xi_t^2}{2}} d\xi_w d\xi_t \quad (52)$$

As an example, shown below is how $\tilde{M}_{3,5}$ is computed. First, note that, $$E(\xi_i^n) = \frac{1}{\sqrt{2\pi}} \int_{-\infty}^{\infty} \xi_i^n e^{-\frac{\xi_i^2}{2}} d\xi_i \quad (53)$$

$$= \begin{cases} 0 & n \text{ odd} \\ \dfrac{n!}{2^{n/2}\left(\dfrac{n}{2}\right)!} & n \text{ even} \end{cases} \quad (54)$$

$$\tilde{M}_{3,5} = \frac{1}{2\pi} \int_{-\infty}^{\infty}\int_{-\infty}^{\infty} M(s,\xi)\Psi_3(\xi)\Psi_5(\xi) e^{-\frac{\xi_w^2+\xi_t^2}{2}} d\xi_w d\xi_t \quad (55)$$

Using $\Psi_3(\xi)=\xi_w$, $\Psi_5(\xi)=\xi_w\xi_t$, and substituting for $M(s,\xi)$ above, one can obtain $$\tilde{M}_{3,5} = \frac{1}{2\pi} \int_{-\infty}^{\infty}\int_{-\infty}^{\infty} M_a(s)\xi_w\xi_t^2 e^{-\frac{\xi_w^2+\xi_t^2}{2}} d\xi_w d\xi_t \quad (56)$$

$$+ \frac{1}{2\pi} \int_{-\infty}^{\infty}\int_{-\infty}^{\infty} M_a(s)\xi_w^2\xi_t^2 e^{-\frac{\xi_w^2+\xi_t^2}{2}} d\xi_w d\xi_t \quad (57)$$

$$+ \frac{1}{2\pi} \int_{-\infty}^{\infty}\int_{-\infty}^{\infty} M_a(s)\xi_w\xi_t^3 e^{-\frac{\xi_w^2+\xi_t^2}{2}} d\xi_w d\xi_t \quad (58)$$

$$M_b \quad (59)$$

The complete matrix $\tilde{M}(s)$, and $\tilde{X}(s)$ are shown below.

$$\tilde{M}(s) = \begin{bmatrix} M_a(s) & M_b(s) & M_c(s) & 0 & 0 & 0 \\ M_b(s) & M_a(s) & 0 & 2M_b(s) & M_c(s) & 0 \\ M_c(s) & 0 & M_a(s) & 0 & M_b(s) & 2M_c(s) \\ 0 & 2M_b(s) & 0 & 2M_a(s) & 0 & 0 \\ 0 & M_c(s) & M_b(s) & 0 & M_a(s) & 0 \\ 0 & 0 & 2M_c(s) & 0 & 0 & 2M_a(s) \end{bmatrix} \quad (60)$$

$$\tilde{X}(s) = (X_1(s), X_2(s), X_3(s), 0, 0, 0)_{12\times 1}^T \quad (61)$$

$$\sum_{i=1}^{NT(r,p)} \left[\int_{D(\xi)} M(s,\xi)\Psi_i(\xi)\Psi_j(\xi)W(\xi)d\xi\right]\alpha_i(s) = \sum_{i=1}^{NT(r,p)} M_{i,j}(s)\alpha_i(s) \quad (62)$$

$$= X(s)\int_{D(\xi)} \Psi_j(\xi)W(\xi)d\xi \quad (63)$$

$$= X(s)c_j, j=1,\ldots,N(p,r) \quad (64)$$

$$\tilde{M}(s)\alpha(s) = c\tilde{X}(s) \quad (65)$$

The above equation can be solved numerically to obtain the coefficient vector $\alpha(s)$. Once the vector $\alpha(s)$ is obtained, there is now an explicit expression for the circuit response $Y(s,\xi)$ in terms of $\xi$. With such an explicit expression the estimates of moments and the probability distribution of the delay from the source node to any node with respect to the random variables $\xi$ can be obtained.

3.2 CMOS Logic Gate Analysis Using SIP Method

The logic gates of a CMOS library are subject to environmental and process variations. The environmental variations are deterministic and are generally handled as constant numerical shifts in the nominal values of the parameters. The process variations are random (with or with out correlations) in nature and are generally handled as perturbations in a $\pm 3\sigma$ region around the nominal values of the parameters. The environmental parameters considered in this analysis are the power supply $V_{dd}$ and device temperature $T_t$. As an example, consider the process variables NMOS threshold voltage $V_{tn}$, PMOS threshold voltage $V_{tp}$, gate oxide thickness $T_{ox}$, and channel length L. With out loss of generality, further assume that $V_{tn}$, $V_{tp}$, $T_{ox}$, L and $T_t$ variables of all the devices in any gate are completely correlated (i.e., the variations in all the devices can be represented by the same set of random variables). In the presence of intra-gate variations, this assumption is not valid and different devices have to be represented by different variables. However, the SIP methodology does not change and the intra-gate variations simply lead to an increase in the number of variables.

Figure 3:
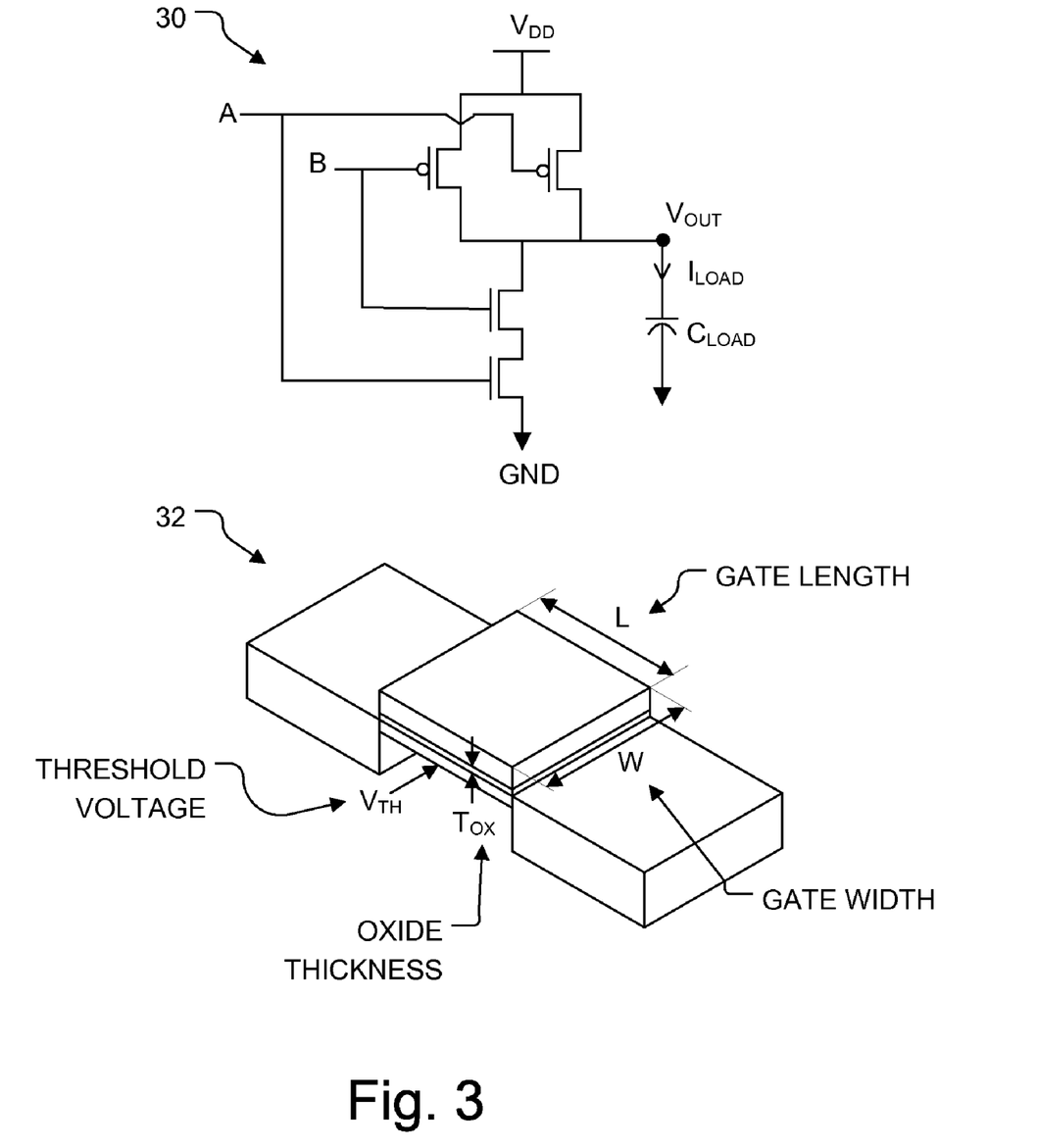
FIG. 3 is a schematic diagram of a gate that has a modeled response that includes a series of orthogonal polynomials that have coefficients derived form a SIP derivation.

In FIG. 3, a CMOS logic gate 30 that comprises multiple transistors is shown. FIG. 3 also shows a general cross section 32 of a transistor and respective device parameters. Consider that $V_{dd}$ can vary in the range $[V_{dd1}, V_{dd2}]$ with-in a die and that $T_t$ varies in the range $[T_{t1}, T_{t2}]$. Let the midpoint of the range of $V_{dd}$ be denoted by $\overline{V}_{dd} = (V_{dd1}+V_{dd2})/2$ and the midpoint of the range of $T_t$ be denoted by $\overline{T}_t = (T_{t1}+T_{t2})/2$. Let the mean and standard deviation of the process variables $V_{tn}$, $V_{tp}$ and L and $T_{ox}$ be $\{\overline{V}_{tn}, \sigma_{V_{tn}}\}$, $\{\overline{V}_{tp}, \sigma_{V_{tp}}\}$, $\{\overline{L}, \sigma_L\}$, and $\{\overline{T}_{ox}, \sigma_{T_{ox}}\}$ respectively. Let the number of total variables be represented by $N_{VAR}$, which is 6 in this case. The goal here is to develop a framework for obtaining the gate delay and leakage as a function of all these deterministic and random variables.

In the presence of environmental and process variations, the variables can be expressed as follows.

$$V_{dd} = \frac{V_{dd1} + V_{dd2}}{2} + \Delta_V, \quad T_t = \frac{V_{t1} + V_{t2}}{2} \Delta_T \quad (66)$$

$$V_{tn} = \overline{V}_{tn} + \sigma_{V_{tn}} \xi_{tn}, \quad V_{tp} = \overline{V}_{tp} + \sigma_{V_{tp}} \xi_{tp} \quad (67)$$

$$L = \overline{L} + \sigma_L \xi_1, \quad T_{OX} = \overline{T}_{OX} + \sigma_{T_{OX}} \xi_{OX} \quad (68)$$

$$\vec{\xi} = (\Delta_V, \Delta_T, \xi_{tn}, \xi_{tp}, \xi_l, \xi_{OX}) \quad (69)$$

The problem may be encountered is to fit a model for the delay as a function of the deterministic variables. One way is to initially pick a few values in the range of the $V_{dd}$ and $T_t$, and for each combination of these values, fit a variational model for the delay as a function of the process variables. However, if there are say M combinations of $V_{dd}$ and $T_t$, this would result in M runs of the algorithm, which can be expensive. So, one way to reduce the complexity is to handle all these variables together. To do so, the variables can be transformed to have a common range of operation and then fit a model in these transformed variables. There are several transforms that can be defined, which can translate the $V_{dd}$ and $T_t$ variables. Legendre polynomials have been extensively used in approximation theory to fit deterministic models for responses of variables. However in the context of randomness, the same Legendre polynomials are used to be the appropriate basis for responses of variables, whose distribution is Uniform. If these two links are observed, the best mathematical transformation (or formula) that can be used is the formula used for transformation from uniform to Gaussian transformation. And hence, assume that these deterministic variables vary with a uniform distribution. It is highly important to note that there is no physical meaning in using the uniform-to-Gaussian transforms for $V_{dd}$ and $T_t$. Rather, this a well-justified mathematical transformation for these variables from one range to another range. In fact, the purpose of having a unified equation in all these variables is that given the value of $V_{dd}$ and $T_t$, one can substitute those values in the unified model and then obtain a variational equation in the process variables at those values.

The way that this issue is addressed is to consider the deterministic variations as uniform random variables. The motivation behind this is that every value of the deterministic variable e.g., $V_{dd}$ in the range $[V_{dd1}, V_{dd2}]$ has an equal probability of occurrence and hence a uniform distribution is a good approximation. Thus, the variables in the presence of variations can be expressed as, $$V_{dd} = V_{dd1} + (V_{dd2} - V_{dd1})\xi_{u1} \quad (70)$$

$$= V_{dd1} + (V_{dd2} - V_{dd1})\left(0.5 + 0.5 erf\left(\frac{\xi_1}{\sqrt{2}}\right)\right) \quad (71)$$

$$T_t = T_{t1} + (V_{t2} - V_{t1})\xi_{u2} \quad (72)$$

$$= T_{t1} + (T_{t2} - T_{t1})\left(0.5 + 0.5 erf\left(\frac{\xi_2}{\sqrt{2}}\right)\right) \quad (73)$$

$$V_{tn0} = \overline{V}_{tn0} \sigma_{V_{tn0}} \xi_3, \quad V_{tp0} = \overline{V}_{tp0} + \sigma_{V_{tp0}} \xi_4 \quad (74)$$

$$T_{OX} = \overline{T}_{OX} + \sigma_{T_{OX}} \xi_5, \quad L = \overline{L} + \sigma_L \xi_6 \quad (75)$$

$$\vec{\xi} = (\xi_1, \xi_2, \xi_3, \xi_4, \xi_5, \xi_6) \quad (76)$$

where $\xi_{\mu 1}, \xi_{\mu 2}$ are standardized uniform random variables in the range $[0,1]$ ($U(0,1)$), and $\xi_1, \xi_2, \xi_3, \xi_4, \xi_5, \xi_6$ are zero mean, unit variance Gaussian random variable ($N(0,1)$). For model development, one needs to express all variations as Gaussian variables and hence the transformations from uniform $\{\xi_{\mu 1}, \xi_{\mu 2}\}$ to Gaussian $\{\xi_1, \xi_2\}$ are used. The error function erf and the relationships governing $\{\xi_{\mu 1}, \xi_{\mu 2}\}$ and $\{\xi_1, \xi_2\}$ are as follows $$\xi_{u1} = \left(0.5 + 0.5 erf\left(\frac{\xi_1}{\sqrt{2}}\right)\right), \xi_1 = \sqrt{2}\, erf^{-1}(2\xi_{u1} - 1) \quad (77)$$

$$\xi_{u2} = \left(0.5 + 0.5 erf\left(\frac{\xi_2}{\sqrt{2}}\right)\right), \sqrt{2}\, erf^{-1}(2\xi_{u2} - 1) \quad (78)$$

$$erf(\xi_i) = \frac{2}{\sqrt{\pi}} \int_0^{\xi_i} e^{-t^2}\, dt,\ erf^{-1}(erf(\xi_i)) = \xi_i \quad (79)$$

Now that all the variation are expressed as a function of Gaussian variables, the modeling for gate delay as a function of the variable vector $\vec{\xi} = (\xi_1, \xi_2, \xi_3, \xi_4, \xi_5, \xi_6)$ can be carried out. The approach below uses a sparse grid based multivariate interpolation technique.

$$d(\vec{\xi}) = \sum_{i=1}^{NT(N_{VAR}, p)} \alpha_i \Psi_i(\vec{\xi}) \quad (80)$$

where $\Psi_i$ are polynomials of order less than p in these variables. $NT(N_{VAR}, p)$ denotes the number of terms and is given as follows.

$$NT(N_{VAR}, p) = \binom{N_{VAR} + p}{p} \quad (81)$$

For example, the following expansion occurs for p=2:

$$d(\vec{\xi}) = a_1 + a_2\xi_1 + a_3\xi_2 + a_4\xi_3 + a_5\xi_4 + a_6\xi_5 + a_7\xi_6 \quad (82)$$

$$+ a_8(\xi_1^2 - 1) + a_9(\xi_2^2 - 1) + a_{10}(\xi_3^2 - 1) + a_{11}(\xi_4^2 - 1) + a_{12}(\xi_5^2 - 1) + a_{13}(\xi_6^2 - 1) \quad (83)$$

$$+ a_{14}\xi_1\xi_2 + a_{15}\xi_1\xi_3 + a_{16}\xi_1\xi_4 + a_{17}\xi_1\xi_5 + a_{18}\xi_1\xi_6 + a_{19}\xi_2\xi_3 a_{20}\xi_2\xi_4 + a_{21}\xi_2\xi_5 \quad (84)$$

$$+ a_{22}\xi_2\xi_6 + a_{23}\xi_3\xi_4 + a_{24}\xi_3\xi_5 + a_{25}\xi_3\xi_6 a_{26}\xi_4\xi_5 + a_{27}\xi_4\xi_6 + a_{28}\xi_5\xi_6 \quad (85)$$

As an example of how this may be applied, consider leakage power (I), which is known to vary exponentially with $\vec{\xi}$ as, $$\log(I(\vec{\xi})) = \sum_{i=1}^{NT(N_{VAR}, p)} b_i \Psi_i(\vec{\xi}) \quad (86)$$

Thus, the coefficients for this type of problem may be solved efficiently and accurately.

Figure 4:
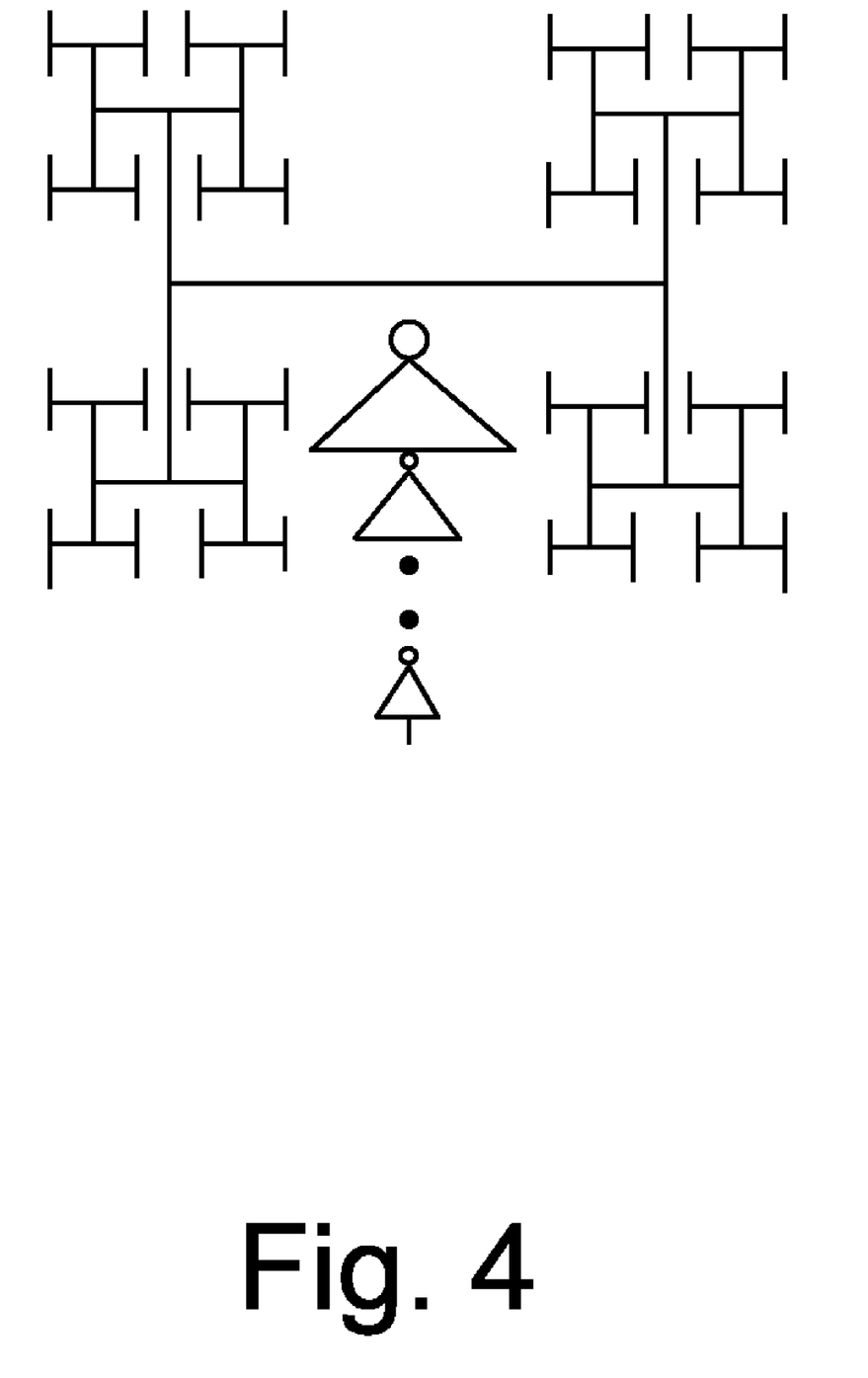
FIG. 4 is a schematic diagram of an H-shaped clock tree.

E. Comparison to Monte Carlo and Perturbation Methods 3.1 Speed Up and Error using the Galerkin Method A software analysis program that employed the Galerkin method was applied to several large H-shaped clock trees taken from a 0.13 micron commercial design (see FIG. 4). Table 3 shows the delay at a sink node computed using the Galerkin method and by stationary phase Monte Carlo simulations (SPMC) for clock trees with a varying number of fanouts. The computation time for both the algorithms in flops (floating point operations) is also shown. It can be observed that an average speed up of about 60x is obtained by the Galerkin method over SPMC. The results of the Galerkin method are based on using expansions up to order 5. This shows that the large inaccuracy of the Elmore delay formula for far end nodes of a clock tree can be avoided using the Galerkin method.

TABLE 4

| # Fan Outs | Monte Carlo | Galerkin | Error % | Monte Carlo | Galerkin | Speed Up |
|---|---|---|---|---|---|---|
| 4 | 137.2 | 137.2 | 0.0 | 2.4 | 0.06 | 40 |
| 16 | 345.1 | 345.4 | 0.06 | 12.3 | 0.21 | 60 |
| 64 | 1284.9 | 1285.4 | 0.02 | 35.5 | 0.48 | 71 |
| 256 | 2263.3 | 2265.4 | 0.1 | 73.9 | 1.3 | 57 |
| 1024 | 4352.7 | 4353.4 | 0.01 | 148.4 | 2.3 | 60 |

3.2 Speed Up and Error using the SIP Method

Figure 5A:
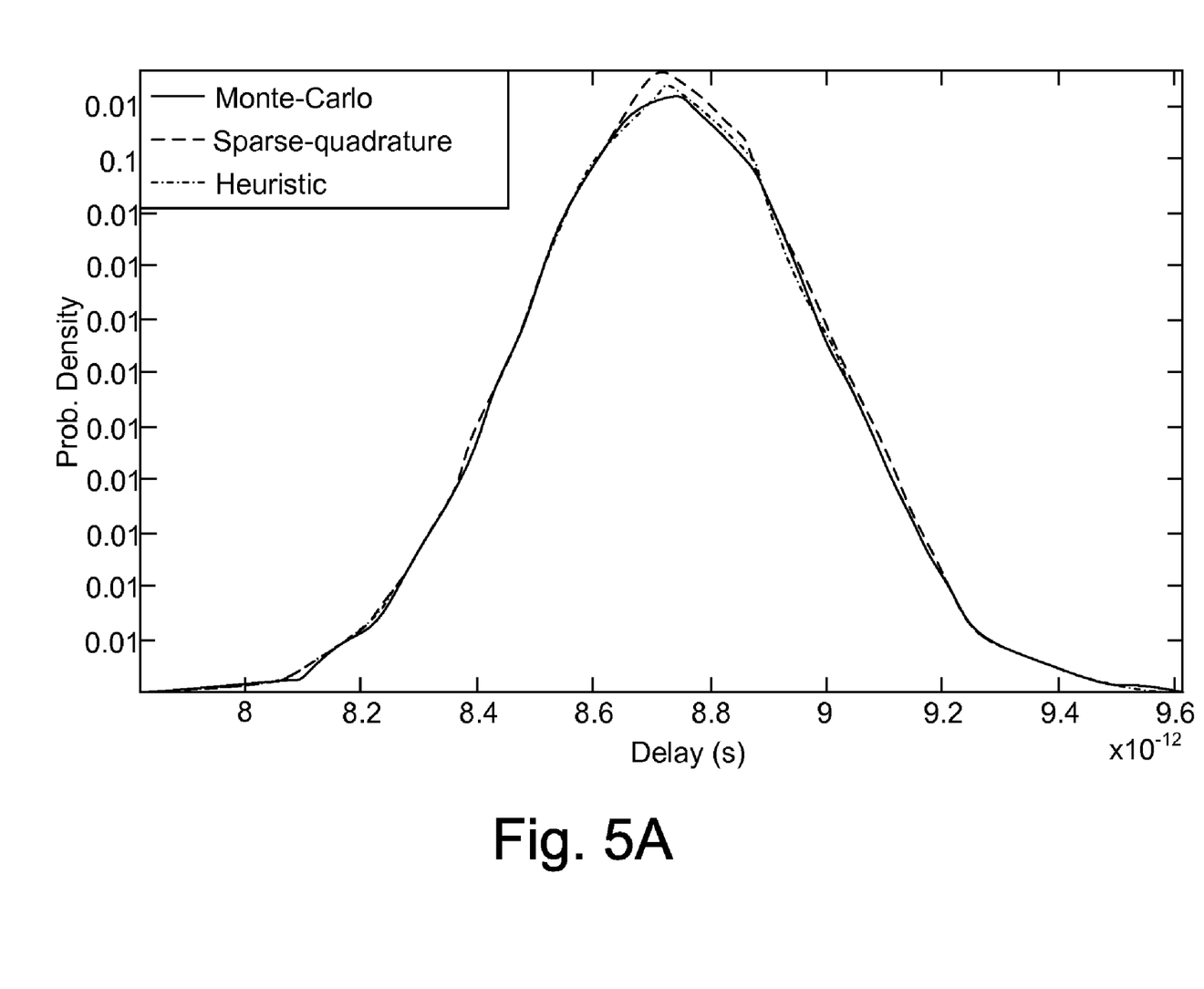
FIGS. 5A-B are plots of the probability distributions and densities of a simulation that was performed using Monte Carlo, sparse quadrature based, and stochastic heuristic based methods.
Figure 5B:
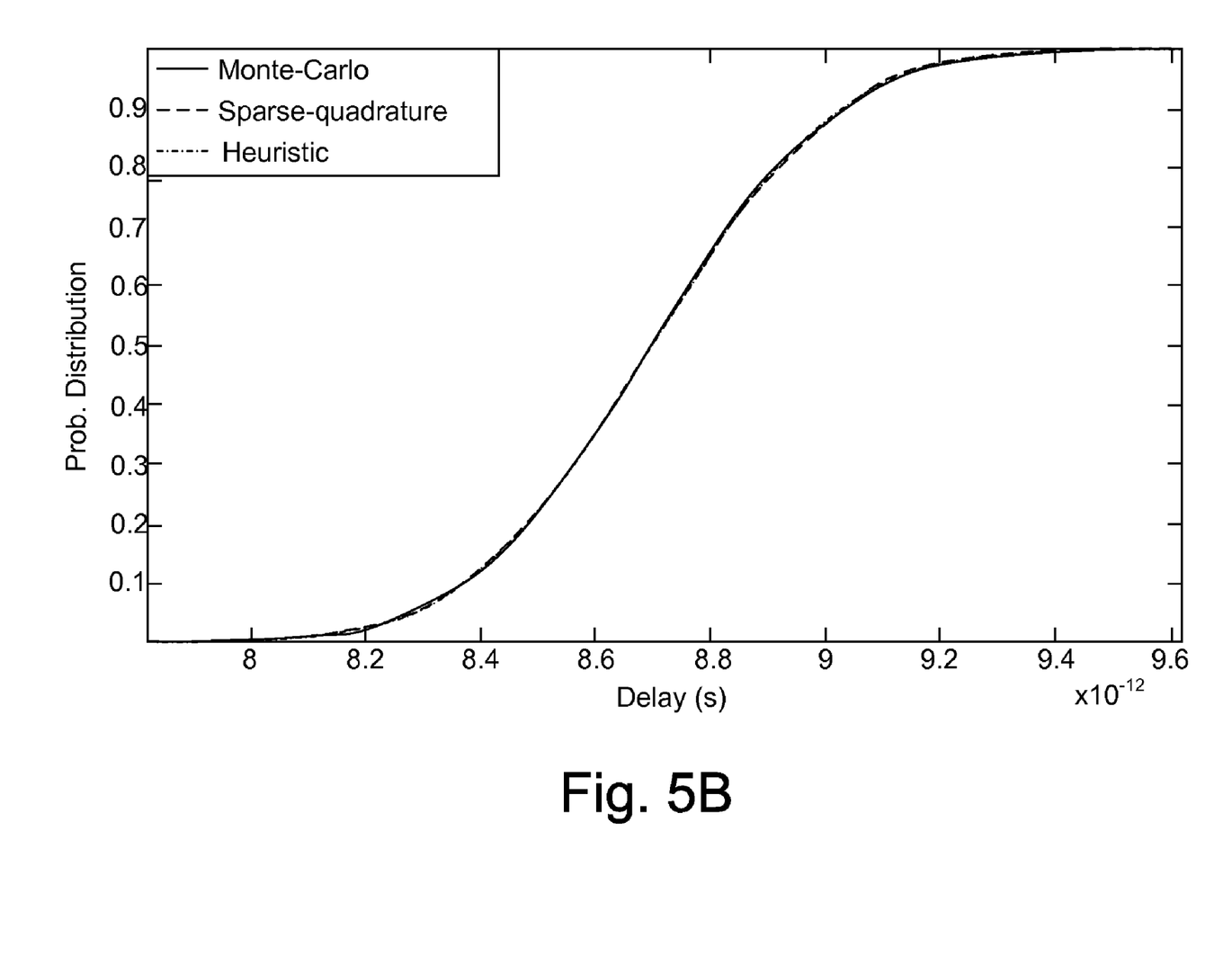

FIGS. 5A-B respectively show probability density and distribution plots for an analysis that was performed on a NAND gate from a SPICE library. In FIGS. 5A-B, the probability density and distribution plots were created using 10,000 Monte Carlo sample points, 313 sparse grid sample points, and 91 stochastic heuristic based sample points. Clearly, the sparse grid and stochastic heuristic based methods produce substantially similar probability densities as a Monte Carlo simulation based method does, however, both of these methods use a far fewer number of sample points, there by generating significant speed-ups.

F. Conclusion

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiments of the above concepts and methods are used.

It should be understood that the programs, processes, methods and systems described herein are not related or limited to any particular type of computer or network system (hardware or software), unless indicated otherwise. Various types of general purpose or specialized computer systems may be used with or perform operations in accordance with the teachings described herein.

In view of the wide variety of embodiments to which the principles of the present application can be applied, it should be understood that the illustrated embodiments are exemplary only, and should not be taken as limiting the scope of the present application. For example, the steps of the flow diagram may be taken in sequences other than those described, and more or fewer elements may be used in other diagrams. While various elements of embodiments have been described as being implemented in software, in other embodiments in hardware or firmware implementations may alternatively be used, and vice-versa.

It will be apparent to those of ordinary skill in the art that methods involved in the disclosure may be embodied in a computer program product that includes a computer usable medium. For example, a computer usable medium can include a readable memory device, such as a hard drive device, CD-ROM, a DVD-ROM, or a computer diskette, having computer readable program code segments stored thereon. The computer readable medium can also include a communications or transmission medium, such as, a bus or a communication link, either optical, wired or wireless having program code segments carried thereon as digital or analog data signals.

The claims should not be read as limited to the described order or elements unless stated to that effect. Therefore, all embodiments that come within the scope and spirit of the following claims and equivalents thereto are claimed as the invention.

What is claimed is:

1. A method for analyzing integrated circuit system performance, the method comprising:
   receiving system variables that correspond to an integrated circuit system;
   normalizing the system variables;
   using an infinite dimensional Hilbert space, modeling a system response as a series of orthogonal polynomials so that the series of orthogonal polynomials has an order N, for arbitrary N;
   solving for coefficients of the series of orthogonal polynomials by using at least one of a first equation representative of the integrated circuit system and a simulated system response of the integrated circuit system;
   wherein the solving for coefficients comprises using the statistical expectation of the product of the system response and the series of orthogonal polynomials;
   wherein using the statistical expectation further comprises performing a multi-dimensional integration over the dimensional space associated with the system variables, wherein the multi-dimensional integration is a numerical integration using simulated system response values, and wherein the multi-dimensional integration comprises at least one of a full quadrature-based integration and a sparse quadrature-based integration.

2. A computer readable medium having stored thereon instructions for causing a processor to execute the method of claim 1.

3. The method of claim 1, further comprising generating a response of the integrated circuit system that includes the solved coefficients.

4. The method of claim 3, wherein the response comprises an equation that is a characteristic of the integrated circuit system.

5. The method of claim 4, wherein the equation corresponds to at least one of a delay time, a voltage response, and a performance of interconnects in the integrated circuit system.

6. The method of claim 1, wherein the equation corresponds to at least one of a delay time, a voltage response of a delay time, a consumed power characteristic, and a performance of a CMOS gate.

7. The method of claim 1, wherein normalizing the system variables comprises normalizing system variables of a Gaussian probability distribution.

8. The method of claim 1, wherein the series of orthogonal polynomials belong to the class of Hermite polynomials.

9. The method of claim 1, wherein normalizing the system variables comprises normalizing system variables of a probability distribution that are described by at least one of numerical data and statistical moments.

10. The method of claim 9, further comprising transforming the normalized system variables into variables of a Gaussian probability distribution.

11. The method of claim 1, wherein normalizing the system variables comprises normalizing the system variables of a probability distribution that includes at least one of a log-normal, gamma, beta, and uniform distribution.

12. The method of claim 11, further comprising transforming the normalized system variables into variables of a Gaussian probability distribution.

13. The method of claim 1, wherein the series of orthogonal polynomials belong to at least one of the classes of Laguerre, Jacobi and Legendre polynomials.

14. The method of claim 1, wherein solving for coefficients further comprises:
   minimizing a norm of the error to obtain a second equation; and
   solving the second equation to obtain the coefficients of the series of orthogonal polynomials.

15. The method of claim 14, wherein the error equation is derived by substituting a truncated series of orthogonal polynomials into the first equation.

16. The method of claim 1, further comprising generating a simulated system response.

17. The method of claim 1, wherein the simulated system response is obtained when the normalized system variables assume the values of zeroes of a set of orthogonal polynomials of order N+1, for arbitrary N.

18. The method of claim 1, wherein solving for the coefficients comprises performing a least mean square fit, using the simulated system response values obtained when the normalized system variables assume the zeroes of a set of orthogonal polynomials of order N+1.

* * * * *